(12) United States Patent
Furukawa et al.

(10) Patent No.: US 7,699,996 B2
(45) Date of Patent: Apr. 20, 2010

(54) SIDEWALL IMAGE TRANSFER PROCESSES FOR FORMING MULTIPLE LINE-WIDTHS

(75) Inventors: Toshiharu Furukawa, Essex Junction, VT (US); John G. Gaudiello, Waterford, NY (US); Mark Charles Hakey, Fairfax, VT (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 531 days.

(21) Appl. No.: 11/680,204

(22) Filed: Feb. 28, 2007

(65) Prior Publication Data

US 2008/0206996 A1  Aug. 28, 2008

(51) Int. Cl.
  *H01B 13/00* (2006.01)
(52) U.S. Cl. .................. 216/13; 216/14; 216/54; 216/72
(58) Field of Classification Search ............ 216/13, 216/14, 54, 72
  See application file for complete search history.

(56) References Cited

U.S. PATENT DOCUMENTS

| | | |
|---|---|---|
| 5,795,830 A | 8/1998 | Cronin et al. |
| 6,063,688 A | 5/2000 | Doyle et al. |
| 6,875,703 B1 | 4/2005 | Furukawa et al. |
| 2004/0119100 A1 | 6/2004 | Nowak et al. |
| 2004/0211953 A1* | 10/2004 | Khouri et al. ............... 257/2 |
| 2005/0153562 A1 | 7/2005 | Furukawa et al. |
| 2005/0245009 A1* | 11/2005 | Bryant et al. ............ 438/151 |
| 2005/0267706 A1* | 12/2005 | Balchiunas ............... 702/117 |
| 2006/0189045 A1* | 8/2006 | Shum et al. ............. 438/148 |
| 2006/0275988 A1* | 12/2006 | Yagishita et al. ........ 438/275 |
| 2007/0007611 A1* | 1/2007 | Park et al. ................ 257/431 |
| 2007/0196980 A1* | 8/2007 | Subramanian ........... 438/253 |
| 2007/0215960 A1* | 9/2007 | Zhu et al. ................ 257/414 |

* cited by examiner

*Primary Examiner*—Binh X Tran
(74) *Attorney, Agent, or Firm*—Schmeiser, Olsen & Watts; Richard M. Kotulak (57) ABSTRACT

A method for simultaneously forming multiple line-widths, one of which is less than that achievable employing conventional lithographic techniques. The method includes providing a structure which includes a memory layer and a sidewall image transfer (SIT) layer on top of the memory layer. Then, the SIT layer is patterned resulting in a SIT region. Then, the SIT region is used as a blocking mask during directional etching of the memory layer resulting in a first memory region. Then, a side wall of the SIT region is retreated a retreating distance D in a reference direction resulting in a SIT portion. Said patterning comprises a lithographic process. The retreating distance D is less than a critical dimension CD associated with the lithographic process. The SIT region includes a first dimension W2 and a second dimension W3 in the reference direction, wherein CD<W2<2D<W3.

20 Claims, 10 Drawing Sheets

FIG. 23

SIDEWALL IMAGE TRANSFER PROCESSES FOR FORMING MULTIPLE LINE-WIDTHS

FIELD OF THE INVENTION

The present invention relates generally to SIT (sidewall image transfer) processes and more particularly to SIT processes for forming multiple line-widths.

BACKGROUND OF THE INVENTION

In the prior art, a conventional lithographic process can be used to form a first line-width greater than or equal to a minimum CD (critical dimension) associated with the lithographic process, or a SIT process can be used to form a second line-width smaller than the CD. Therefore, there is a need for a method for simultaneously forming multiple line-widths greater than and smaller than the CD.

SUMMARY OF THE INVENTION

The present invention provides a structure fabrication method, comprising providing a structure which includes (a) a memory layer, and (b) a sidewall image transfer (SIT) layer on top of the memory layer; patterning the SIT layer, resulting in a SIT region, wherein said patterning comprises a lithographic process; directionally etching the memory layer with the SIT region as a mask, resulting in a first memory region; and retreating a side wall of the SIT region a retreating distance D in a reference direction, resulting in a SIT portion comprising said side wall, wherein the retreating distance D is less than a critical dimension CD associated with the lithographic process, wherein the first memory region includes a first dimension W2 and a second dimension W3 in the reference direction, and wherein CD<W2<2D<W3.

The present invention provides a method for simultaneously forming multiple line-widths greater than and smaller than the CD.

DETAILED DESCRIPTION OF THE INVENTION

Figure 1:
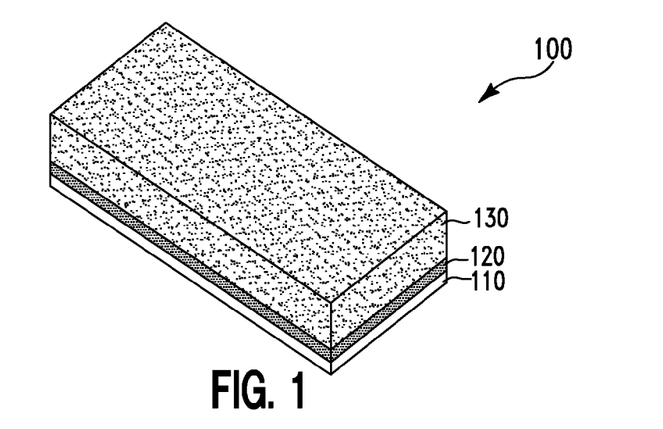
FIGS. 1-14A illustrate the formation of a first semiconductor structure, in accordance with embodiments of the present invention.

FIGS. 1-14A (perspective views) illustrate the fabrication of an integrated circuit component 100, in accordance with embodiments of the present invention. The fabrication of the integrated circuit component 100 can be started with the component 100 of FIG. 1 which comprises (i) a gate electrode layer 110, (ii) a memory layer 120 on top of the gate electrode layer 110, and (iii) a SIT (sidewall image transfer) layer 130 on top of the memory layer 120. It should be noted that the gate electrode layer 110 is formed on a wafer which is not shown for simplicity. In one embodiment, the gate electrode layer 110 comprises polysilicon, the memory layer 120 comprises silicon nitride, and the SIT layer 130 comprises $SiO_2$ (silicon dioxide).

Figure 2:
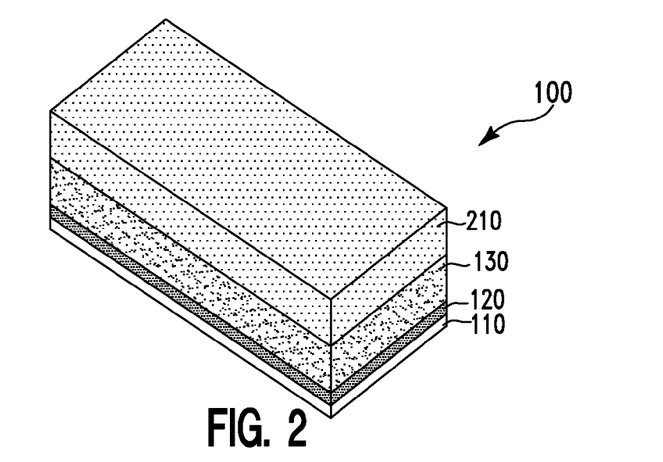

Next, with reference to FIG. 2, in one embodiment, a photo resist layer 210 is formed on top of the SIT layer 130. The photo resist layer 210 can be formed by spin applying a photo resist material on top of the integrated circuit component 100 of FIG. 1.

Figure 3:
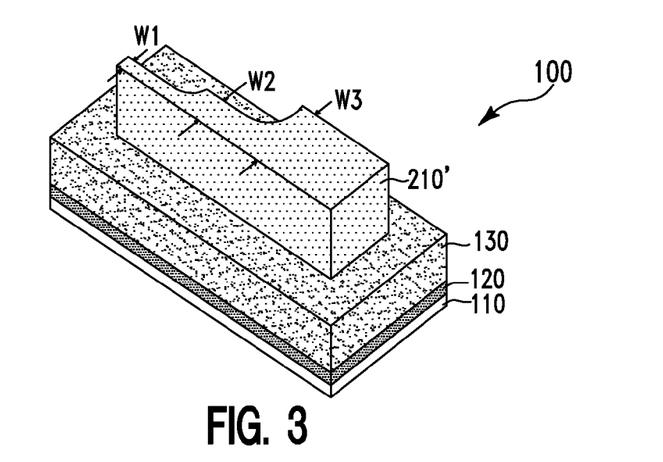

Next, in one embodiment, the photo resist layer 210 is patterned using a conventional lithographic process, resulting in a patterned photo resist layer 210' as shown in FIG. 3.

With reference to FIG. 3, assume that W1 and W2 are two dimensions of the patterned photo resist layer 210'. It should be noted that W1 and W2 are greater than CD (critical dimension). Critical dimension is a smallest dimension of geometrical features (width of interconnect line, contacts, trenches, etc.) which can be practically formed without any deformation or distortion during semiconductor device/circuit manufacturing. It should be noted that the critical dimension is associated with said patterning process described in FIG. 3.

Figure 4:
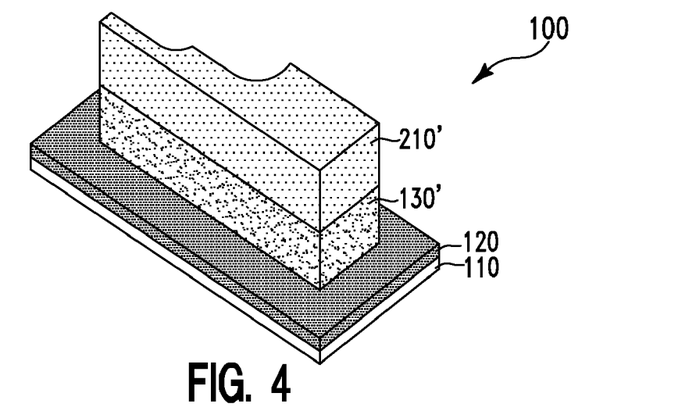

Next, with reference to FIG. 3, in one embodiment, the patterned photo resist layer 210' is used as a mask during directional etching of the SIT layer 130, resulting in a SIT region 130', as shown in FIG. 4. This directional etching process can be a RIE (reactive ion etching) process.

Figure 5:
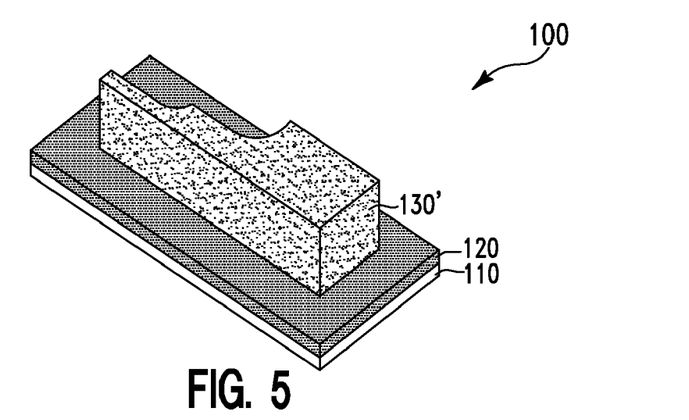

Next, with reference to FIG. 4, in one embodiment, the patterned photo resist layer 210' is removed using a wet etching process, resulting in the component 100 of FIG. 5.

Figure 6:
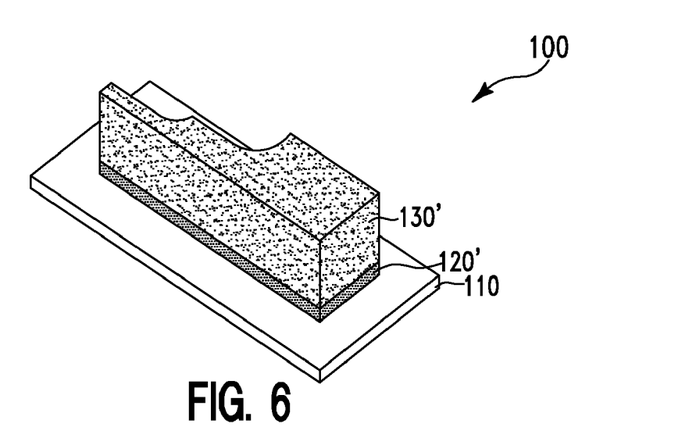

Next, with reference to FIG. 5, in one embodiment, the SIT region 130' is used as a mask during directional etching of the memory layer 120, resulting in a memory region 120', as shown in FIG. 6. This etching process can be a RIE process.

Figure 7:
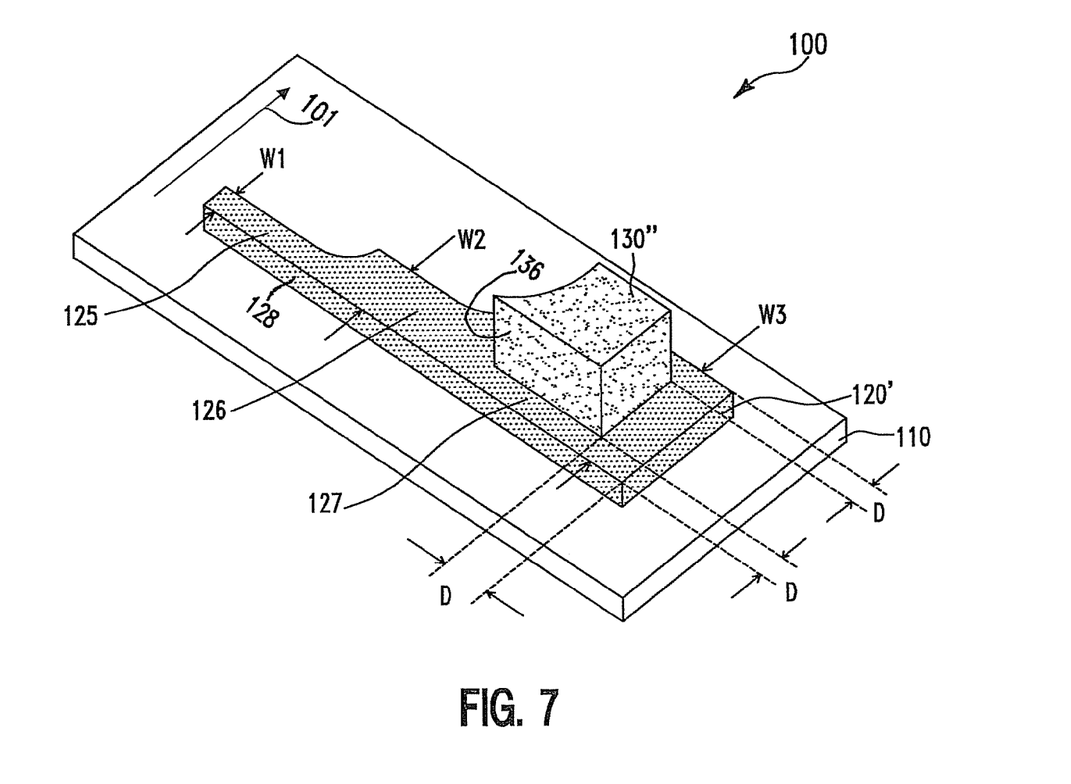

Next, with reference to FIG. 6, in one embodiment, SIT regions 130' is isotropically etched, using a process such as COR (chemical oxide removal), resulting in a SIT region 130", as shown in FIG. 7

With reference to FIG. 7, it should be noted that a portion 125 and a portion 126 of the memory region 120' have the widths W1 and W2, respectively. D is a distance by which the sidewalls of the SIT region 130" retreat from their original positions as a result of the COR process. Assume that D<W1<W2<2D<W3, wherein W3 is the width of portion 127 of the memory region 120'. Assume further that D<CD. As a result, the COR process results in the SIT portion 130" of the SIT region 130' (FIG. 6) only on the region 127 of the memory region 120' as shown in FIG. 7. For example, CD=10 nm (nanometer), W1=14 nm, W2=16 nm, W3=30 nm, and D=9 nm.

Figure 8:
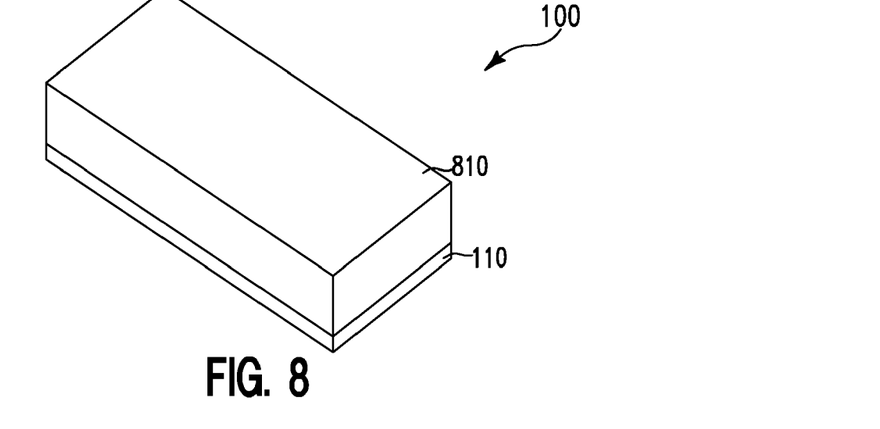

Next, with reference to FIG. 8, in one embodiment, a protective layer 810 is formed on top of the component 100 of FIG. 7. The protective layer 810 can comprise polymer. Illustratively, the protective layer 810 is formed by spin applying polymer on top of the component 100 of FIG. 7.

Figure 9:
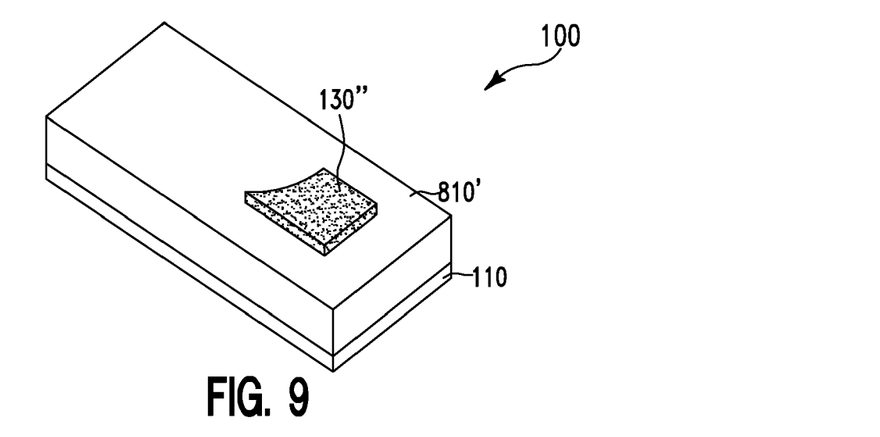

Next, in one embodiment, the protective layer 810 is etched back such that a top surface 131 of the SIT region 130" is exposed to the surrounding ambient as shown in FIG. 9. This etching process can be wet etching or RIB process. In one embodiment, the etching process is selective to the SIT region 130". What remains of the protective layer 810 of FIG. 8 after this etching process can be referred to as a protective layer 810' as shown in FIG. 9. Memory layer 120' (FIG. 7) must remain everywhere protected by the protective layer 810' following this etching process. A reference direction 101 is directed from a planar side wall 128 of the memory layer 120' to a plane comprising a side wall 136 of the SIT region 130", wherein the reference direction 101 is perpendicular to the planar side wall 128.

Figure 10:
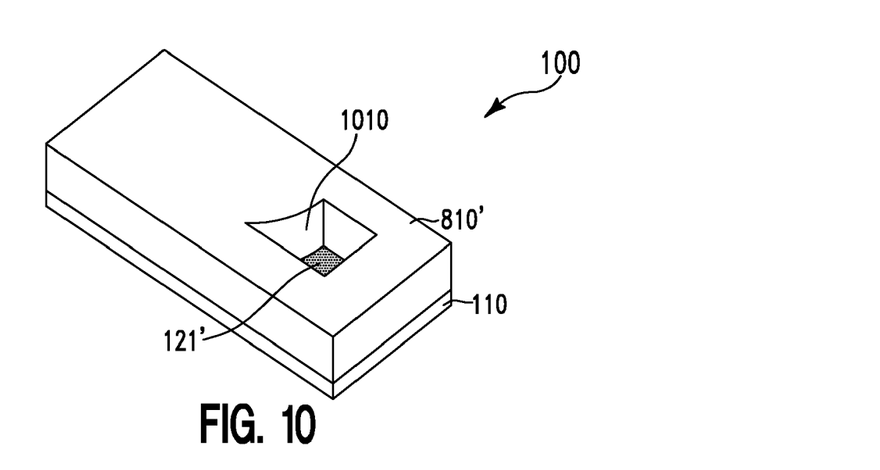

Next, with reference to FIG. 9, in one embodiment, the SIT region 130" is removed. The SIT region 130" can be removed using a wet etching process, resulting in a hole 1010 in the protective layer 810', as shown in FIG. 10. In one embodiment, this wet etching process is selective to the protective layer 810' and the memory region 120' such that a top surface 121' of the memory region 120' (can also be seen in FIG. 7) is exposed to the surrounding ambient through the hole 1010.

Figure 11:
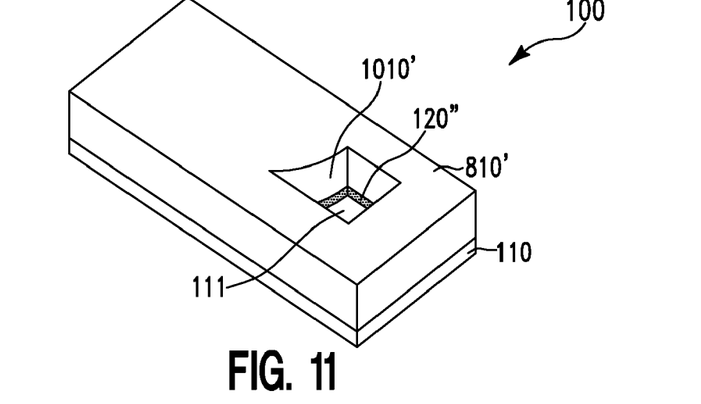

Next, with reference to FIG. 10, in one embodiment, the protective layer 810' is used as a blocking mask during directional etching of the memory region 120', resulting in a hole 1010' and a memory region 120'', as shown in FIG. 11. More specifically, the memory region 120' (FIG. 10) is etched using RIE process such that a top surface 111 of the gate electrode layer 110 is exposed to the surrounding ambient through the hole 1010' (FIG. 11).

Figure 12:
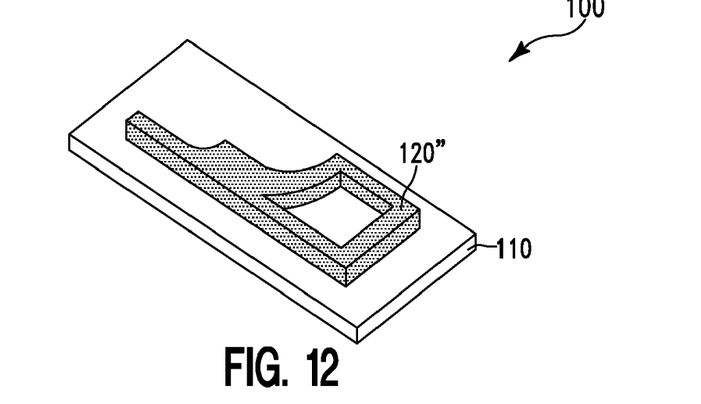

Next, with reference to FIG. 11, in one embodiment, the protective layer 810' is removed, resulting in component 100 of FIG. 12. More specifically, the protective layer 810' is removed by a wet etching process.

Figure 13:
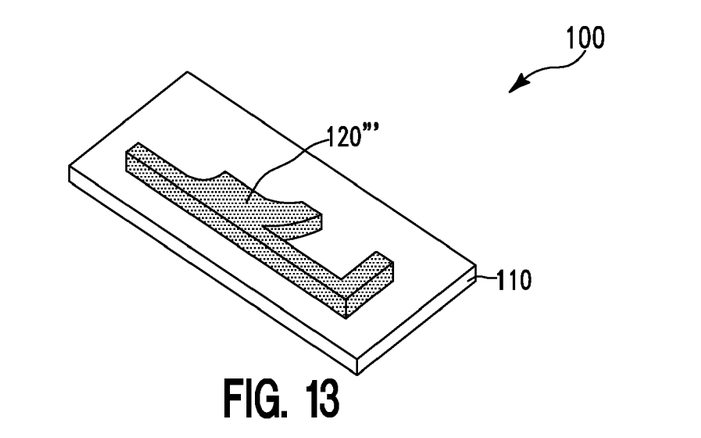

Next, with reference to FIG. 12, in one embodiment, the memory region 120'' is further patterned, resulting in a memory region 120''', as shown in FIG. 13. More specifically, the memory region 120'' can be patterned using lithographic and etching processes. This patterning removes undesired portions of the memory region 120''.

Figure 14:
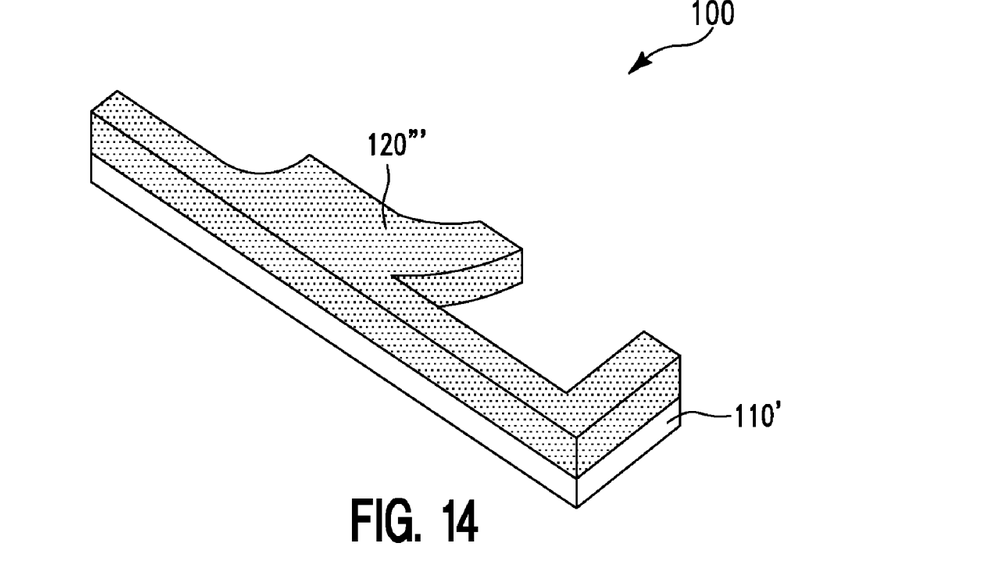

Next, with reference to FIG. 13, in one embodiment, the memory region 120''' is used as a blocking mask during directional etching of the gate electrode layer 110, resulting in a patterned gate electrode region 110', as shown in FIG. 14. Illustratively, the gate electrode layer 110 can be etched using a RIE process.

Figure 14A:
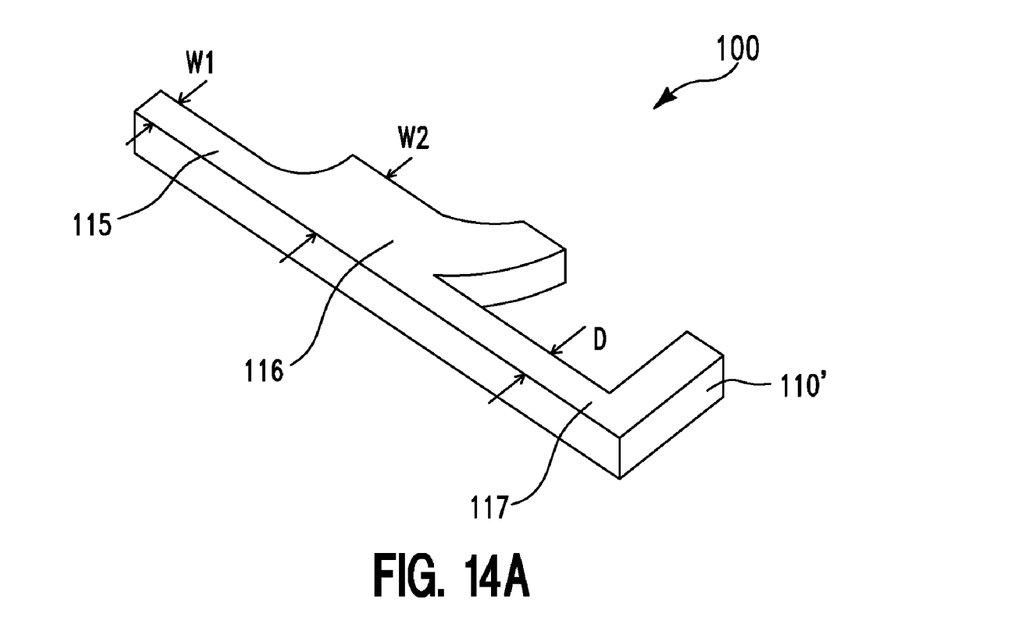
Figure 15:
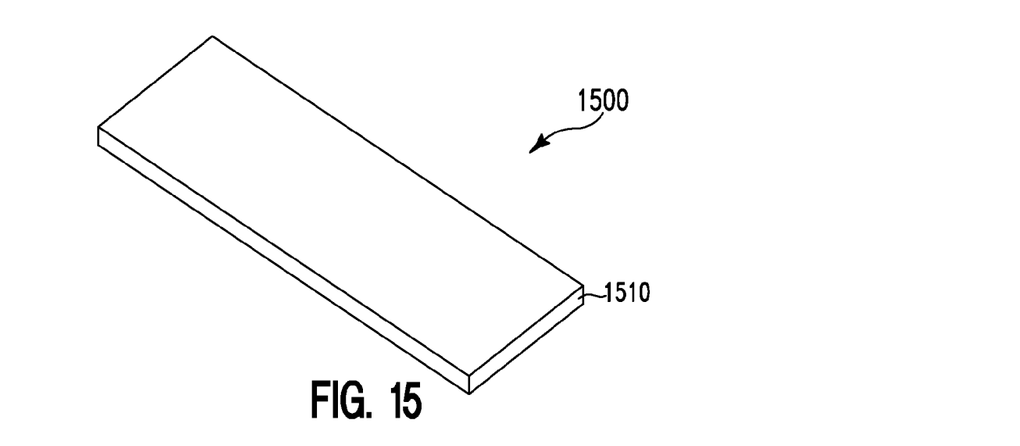
FIGS. 15-23 illustrate the formation of a second semiconductor structure, in accordance with embodiments of the present invention.

Next, with reference to FIG. 14, in one embodiment, the memory region 120''' is removed using a wet etching process, resulting in the patterned gate electrode region 110' of component 100 of FIG. 14A.

As a result of the fabrication process from FIG. 1 to FIG. 14A, a portion 115, a portion 116 and a portion 117 of the patterned gate electrode layer 110' has the widths W1, W2, and D, respectively. As mentioned above, the width D is less than critical dimension. Besides, the widths W1 and W2 are greater than CD. In other words, the fabrication process of FIG. 1-14A forms the patterned gate electrode region 110' having different dimensions greater and smaller than CD. In one embodiment, the portion 115 can be used to form a gate electrode of a pFET (not shown), the portion 116 can be used to form a connection, and the portion 117 is used to form a gate electrode of an nFET (not shown).

In summary, the fabrication process of FIGS. 1-14A provides the component 100 of FIG. 14A having dimensions greater than and less than CD (W1>CD, W2>CD, D<CD). These portions can be used for different purposes.

FIGS. 15-20 (perspective views) illustrate a fabrication process of an integrated circuit component 1500, in accordance with embodiments of the present invention. More specifically, with reference to FIG. 15, the fabrication process can be started with providing a gate electrode layer 1510. The gate electrode layer 1510 can comprise polysilicon. It should be noted that the gate electrode layer 1510 is formed on a wafer which is not shown for simplicity.

Figure 16:
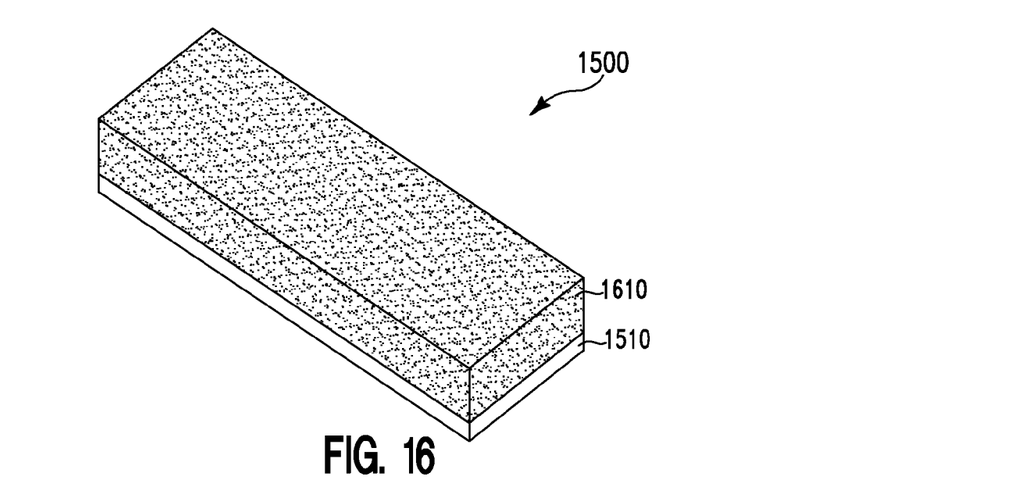

Next, with reference to FIG. 16, in one embodiment, a mandrel layer 1610 is formed on top of the gate electrode layer 1510. The mandrel layer 1610 can be formed by CVD (chemical vapor deposition) of $SiO_2$ everywhere on top of the gate electrode layer 1510.

Figure 17:
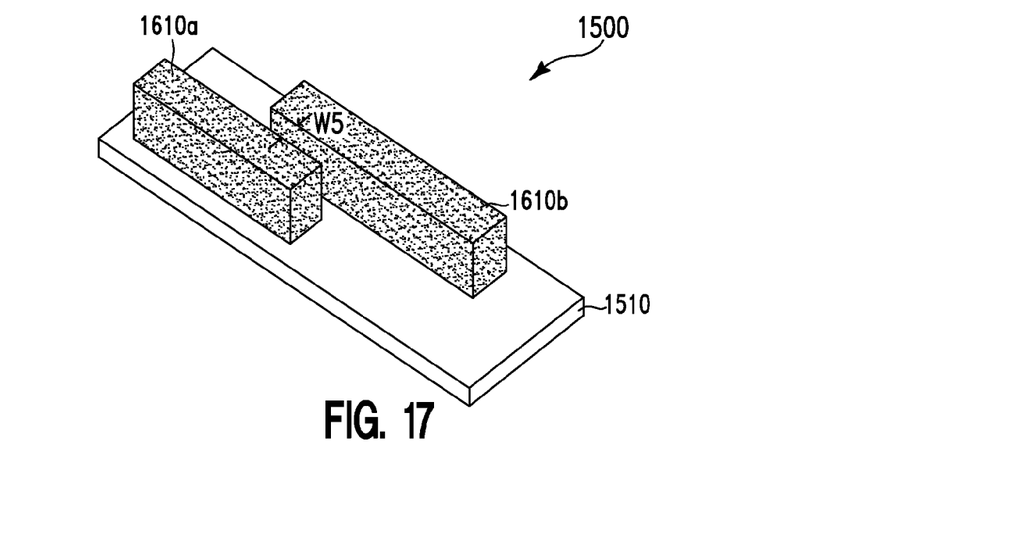
Figure 18:
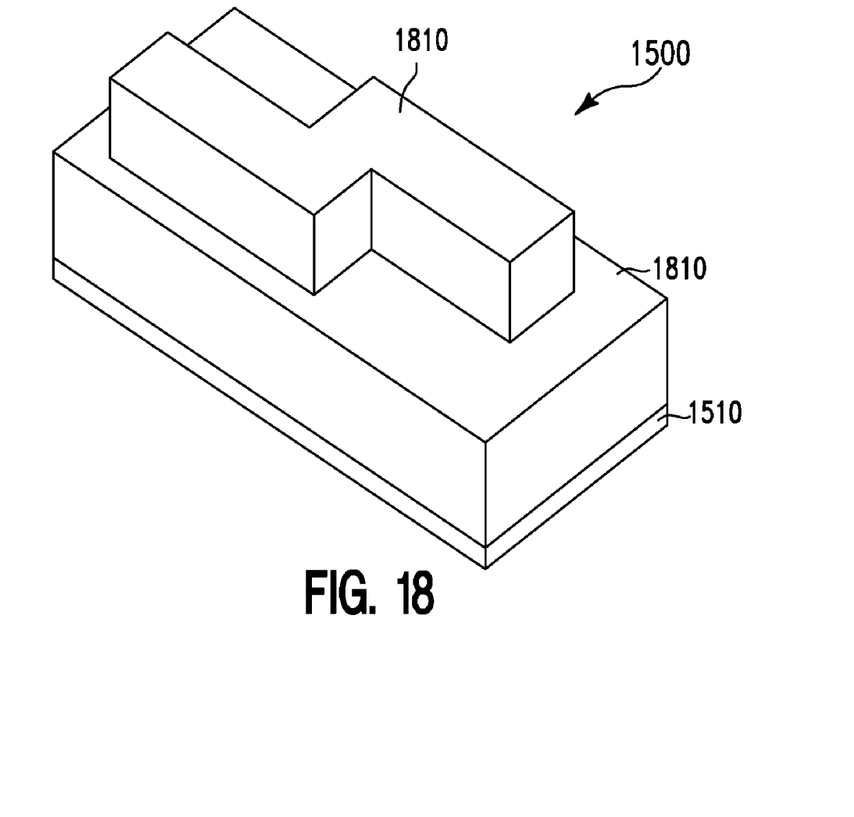

Next, in one embodiment, the mandrel layer 1610 is patterned, resulting in mandrel regions 1610a and 1610b, as shown in FIG. 17. More specifically, the mandrel layer 1610 can be patterned using lithographic and etching processes.

It should be noted that, a dimension W5 is a distance between the mandrel regions 1610a and 1610b. The dimension W5 is greater than the CD associated with the lithography processes above Next, with reference to FIG. 18, in one embodiment, a spacer layer 1810 is formed on top of the component 1500 of FIG. 17. The spacer layer 1810 can comprise silicon nitride. In one embodiment, the spacer layer 1810 is formed by CVD of silicon nitride everywhere on top of the component 1500 of FIG. 17 such that the silicon nitride material covers all the mandrel regions 1610a and 1610b.

Figure 19:
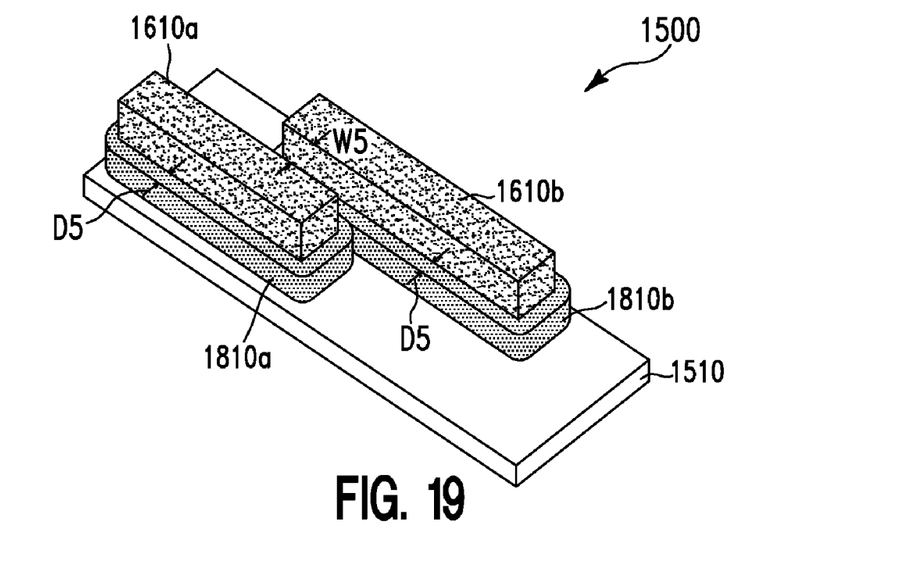

Next, in one embodiment, the spacer layer 1810 is anisotropically etched back, resulting in spacer regions 1810a and 1810b on side walls of the mandrel regions 1610a and 1610b, respectively, as shown in FIG. 19. More specifically, the spacer layer 1810 can be etched using RIE process.

It should be noted that, a dimension D5 is a width of the spacer regions 1810a and 1810b. In one embodiment, this etching back process is performed such that D5<CD, and W5<2×D5. The condition that W5<2=D5 ensures that the two spacer regions 1810a and 1810b remain in direct physical contact with each other. For example, CD=10 nm, W5=14 nm, and D5=8 nm.

Figure 20:
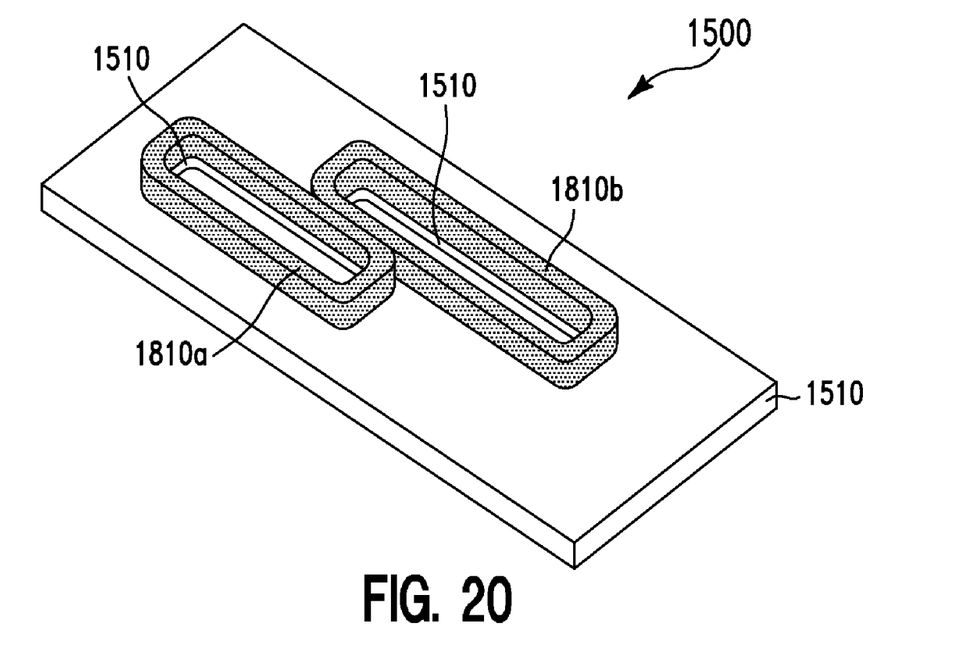

Next, with reference to FIG. 19, in one embodiment, the mandrel regions 1610a and 1610b are removed, resulting in component 1500 of FIG. 20. More specifically, the mandrel regions 1610a and 1610b can be removed using a wet etching process. The wet etching process is selective to the spacer regions 1810a and 1810b.

Figure 21:
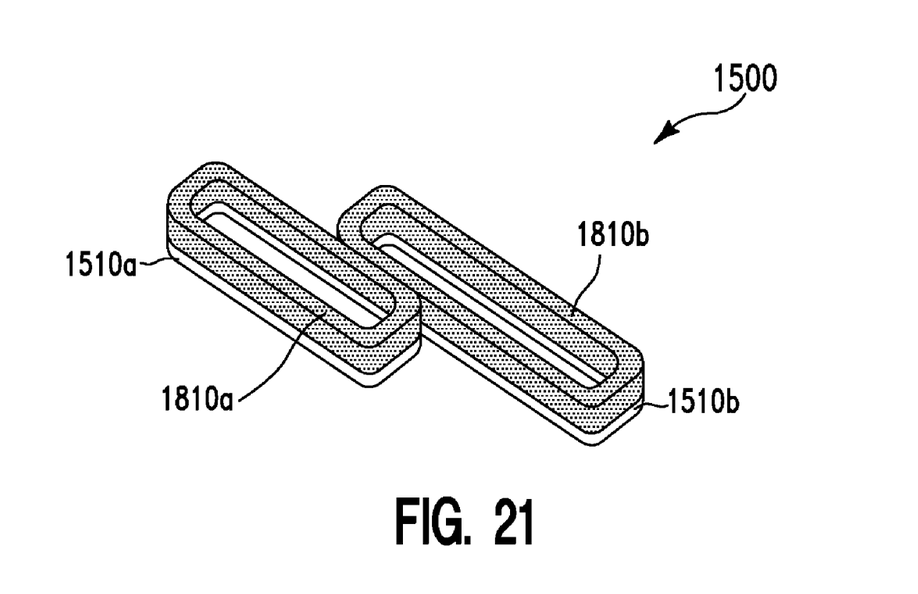

Next, with reference to FIG. 20, in one embodiment, the spacer regions 1810a and 1810b are used as masks during directional etching of the gate electrode layer 1510, resulting in gate electrode regions 1510a and 1510b, as shown in FIG. 21. The gate electrode layer 1510 can be patterned using a RIE process.

Figure 22:
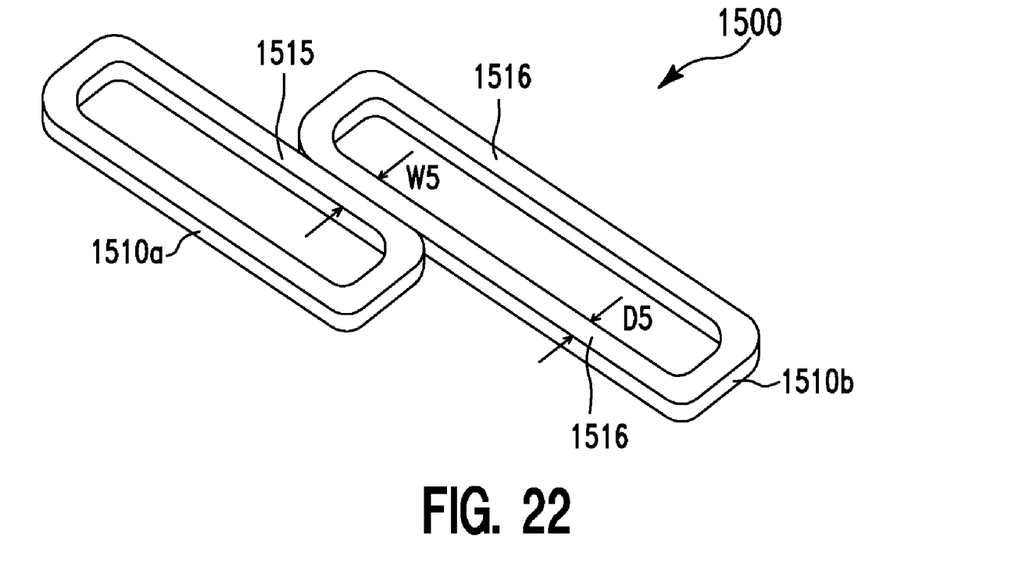

Next, with reference to FIG. 21, in one embodiment, the spacer regions 1810a and 1810b are removed, resulting in component 1500 of FIG. 22. More specifically, the spacer regions 1810a and 1810b can be removed using a wet etching process.

Figure 23:
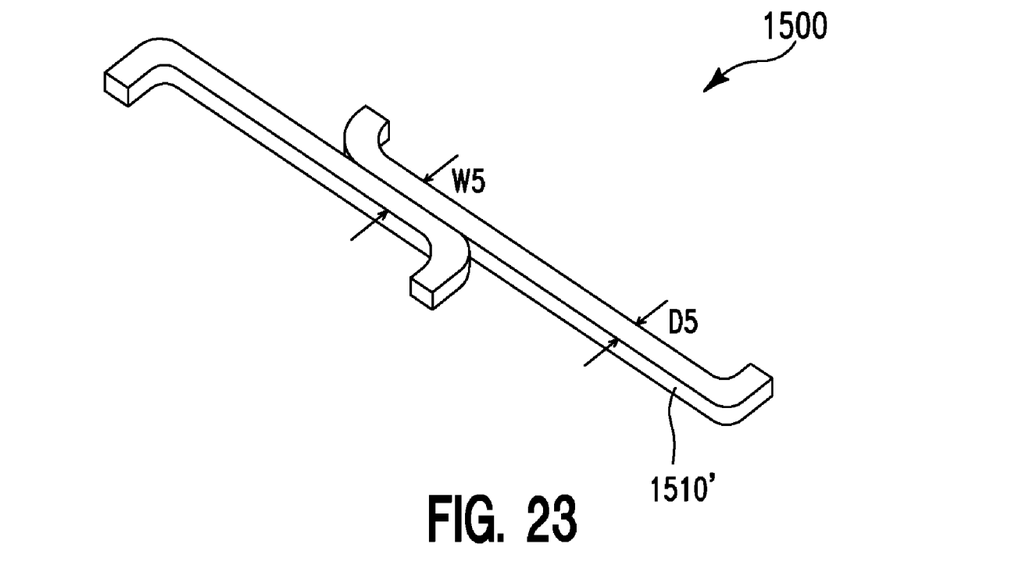

Next, with reference to FIG. 22, in one embodiment, the gate electrode regions 1510a and 1510b are further patterned using lithographic and etching processes, resulting in a gate electrode region 1510' of FIG. 23. This further patterning removes undesired portions of the spacer regions 1810a and 1810b.

Next, in one embodiment, additional fabrication steps can be performed on different portions of the gate electrode region 1510' of FIG. 23 to form different semiconductor devices (not shown).

In summary, the fabrication process of FIGS. 15-23 provides the component 1500 of FIG. 23 having different portions with different dimensions greater than and less than CD (W5>CD, and D5<CD). These portions can be used for different purposes.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure fabrication method, comprising:
providing a structure which includes:
a wafer
a gate electrode layer on the wafer;
a memory layer on the gate electrode layer, and a sidewall image transfer (SIT) layer on the memory layer;

patterning the SIT layer, resulting in a SIT region, wherein said patterning comprises a lithographic process;

directionally etching the memory layer with the SIT region as a mask, resulting in a first memory region; and retreating a first side wall of the SIT region a retreating distance D in a reference direction as measured from a planar side wall of the first memory region, resulting in a SIT portion comprising the first side wall, wherein the first side wall is parallel to a planar side wall, wherein the retreating distance D is less than a critical dimension CD associated with the lithographic process, wherein the first memory region includes a first dimension W2 and a second dimension W3 in the reference direction as measured from the planar side wall, wherein after said retreating has been performed, the reference direction is directed from the planar side wall to a plane comprising the first side wall and is perpendicular to the planar side wall, and wherein CD<W2<2D<W3.

2. The method of claim 1, wherein the SIT region further includes a third dimension W1 in the reference direction, and wherein CD<W1<W2.

3. The method of claim 1, wherein said retreating comprises a chemical oxide removal (COR) process performed on the SIT region.

4. The method of claim 1, wherein the memory layer comprises silicon nitride.

5. The method of claim 1, wherein the SIT layer comprises a dielectric material.

6. The method of claim 1, further comprising, after said retreating is performed, transferring an image of the first side wall of the SIT portion to the first memory region, resulting in a second memory region.

7. The method of claim 6, wherein said transferring comprises:

forming a protective layer on the first memory region and the SIT portion; then etching back the protective layer, resulting in a top surface of the SIT portion being exposed to a surrounding ambient, wherein said etching back is selective to the SIT portion; then removing the SIT portion such that said removing is selective to the etched protective layer and the first memory region; then directionally etching the first memory region with the etched protective layer as a blocking mask, resulting in the second memory region; and then removing the etched protective layer.

8. The method of claim 7, wherein said directionally etching the first memory region comprises reactive ion etching (RE) of the first memory region.

9. The method of claim 7, wherein the protective layer comprises a polymer.

10. The method of claim 6, wherein the second memory region comprises a closed loop.

11. The method of claim 10, further comprising patterning the second memory region, resulting in the closed loop being opened.

12. An integrated circuit component fabrication method comprising:

providing a structure which includes:
a wafer;
a gate electrode layer on the wafer, and
a mandrel layer on the gate electrode layer;

patterning the mandrel layer, resulting in a first mandrel region and a second mandrel region, wherein said patterning the mandrel layer comprises a lithographic process, wherein a first side wall of the first mandrel region and a second side wall of the second mandrel region are essentially parallel to each other, wherein the first side wall defines a reference direction perpendicular to the first side wall, and wherein a mandrel distance W5 between the first and second side walls in the reference direction is greater than a critical dimension CD associated with the lithographic process; and forming a first spacer region on the first side wall of the first mandrel region and a second spacer region on the second side wall of the second mandrel region, wherein the first and second spacer regions are in direct physical contact with each other across the mandrel distance W5, and wherein a width D5 of the first and second spacer regions in the reference direction is less than the CD and satisfies the equation 2 D5>W5.

13. The method of claim 12, wherein said forming the first and second spacer regions comprises:

forming a spacer layer on the first and second mandrel regions and the gate electrode layer; and then directionally etching back the spacer layer, resulting in the first and second spacer regions.

14. The method of claim 12, wherein the gate electrode layer comprises polycrystalline silicon.

15. The method of claim 12, wherein the mandrel layer comprises silicon dioxide.

16. The method of claim 12, wherein the first and second spacer regions comprise silicon nitride.

17. The method of claim 12, further comprising transferring images of the first and second spacer regions to the gate electrode layer, resulting in a patterned region, wherein the paftemed region is what remains of the gate electrode layer after said transferring is performed.

18. The method of claim 17, wherein said transferring comprises:

removing the first and second mandrel regions such that the gate electrode layer is exposed to a surrounding ambient through empty spaces of the removed first and second mandrel regions; then directionally etching the gate electrode layer with the first and second spacer regions as masks, resulting in the patterned region; and then removing the first and second spacer regions.

19. The method of claim 18, where in the patterned region comprises two closed loops.

20. The method of claim 19, further comprising patterning the patterned region, resulting in the two closed loops being opened.

* * * * *